United States Patent [19] [11] 4,333,157
Lee [45] Jun. 1, 1982

[54] SWITCHED-CAPACITOR FLOATING-INDUCTOR SIMULATION CIRCUIT

[75] Inventor: Man S. Lee, Belmont, Calif.

[73] Assignee: GTE Automatic Electric Laboratories, Inc., Northlake, Ill.

[21] Appl. No.: 162,981

[22] Filed: Jun. 25, 1980

[51] Int. Cl.³ .................. G06G 7/62; H03H 11/00
[52] U.S. Cl. .................................. 364/802; 333/214
[58] Field of Search .............. 364/802, 825; 333/214, 333/215, 109; 328/167; 307/109, 110

[56] References Cited

U.S. PATENT DOCUMENTS

| 3,750,037 | 7/1973 | Schmidt | 333/214 X |
| 3,835,399 | 9/1974 | Holmes | 333/214 X |
| 3,886,469 | 5/1975 | Rollet et al. | 333/214 X |
| 3,936,777 | 2/1976 | Rollet et al. | 333/214 X |
| 4,168,440 | 9/1979 | Gray | 333/214 X |

OTHER PUBLICATIONS

Hosticka et al.,–"Switched–Capacitor Simulation of Grounded Inductors and Gyrators"–Electronics Letters–Nov. 23, 1978–pp. 788–790.
Fettweis–"Basic Principles of Switched–Capacitor Filters Using Voltage Inverter Switches"–Arch. Electron. & Ubertragungstech–1979, vol. 33, pp. 13–19.
Viswanathan et al.–"Switched–Capacitor Transconductance Elements and Gyrators"–Electronics Letters–May 24, 1979, vol. 15, No. 11–pp. 318–319.
Lee–"Switched–Capacitor Filters Using Floating-Inductance Simulation Circuits"–Electronics Letters–Sep. 27, 1979, vol. 15, No. 20–pp. 644–645.
Temes et al.–"Switched–Capacitor Circuits Bilinearly Equivalent to Floating Inductor or F.D.N.R."–Electronics Letters–Feb. 1, 1979, vol. 15, No. 3–pp. 87, 88.
Sanchez-Sinencio et al.–"Switched–Capacitor Simulation of Grounded Inductors Using Operational Amplifier Pole"–Electronics Letters–Mar. 15, 1979–vol. 15, No. 6, pp. 169, 170.
Temes et al.–"Compensation for Parasitic Capacitances in Switched–Capacitor Filters"–Electronics Letters–Jun. 21, 1979–vol. 15, No. 13–pp. 377–379.
Moschytz–"Inductorless Filters–A Survey"–IEEE Spectrum Aug. 1970–pp. 30,36.

Primary Examiner—Joseph F. Ruggiero
Attorney, Agent, or Firm—Russell A. Cannon

[57] ABSTRACT

This simulation circuit is a one-port network having a pair of nodes connected to inputs of first and second voltage followers that have associated switched capacitors alternately connected across them for being discharged and connected to an integrator for being charged to the output voltage on the latter. A third switched capacitor is alternately connected in series with the voltage follower outputs for sensing the input voltage applied to the nodes, and connected to the integrator where the input voltage is integrated and transferred to the first and second switched capacitors. A floating inductance $L = T^2 C_4 / C_1 C_3$ is simulated across the nodes, where T is the reciprocal of the switching frequency, C1, C2 and C3 are the capacitances of associated switched capacitors, C1=C2, C4 is the capacitance in the integrator, and the circuit is characterized by the LDI transformation.

17 Claims, 3 Drawing Figures

SWITCHED-CAPACITOR FLOATING-INDUCTOR SIMULATION CIRCUIT

BACKGROUND OF THE INVENTION

This invention relates to switched capacitor circuits and more particularly to a switched capacitor circuit for simulating a floating inductor that is generally insensitive to parasitic capacitance effects associated with integrated capacitors thereof.

Fully integrated circuits including active filters require networks for simulating inductors since they can not be fabricated directly in integrated circuit form. Switched capacitor techniques have therefore evolved for providing networks that simulate inductors, as well as other types of circuit elements such as resistors, gyrators and FDNR's. Switched capacitor networks for simulating grounded inductors are disclosed in: Switched-Capacitor Simulation of Grounded Inductors and Gyrators by B. J. Hosticka and G. S. Moschytz, *Electronics Letters,* Nov. 23, 1978, Vol. 14, No. 24, pages 788–790; Switched-Capacitor Simulation of Grounded Inductors Using Operational-Amplifier Pole by E. Sanchez-Sinencio and E. L. Gomes-Osoric, *Electronics Letters,* Mar. 15, 1979, Vol. 15, No. 6, pages 169–170; and Switched-Capacitor Transconductance Elements and Gyrators by T. R. Viswanathan, J. Vlach, and K. Singhal, *Electronics Letters,* May 24, 1979, Vol. 15, No. 11, pages 318–319. Switched capacitor networks for simulating floating inductors are described in: Switched-Capacitor Circuits Bilinearly Equivalent to Floating Inductor or FDNR, by G. C. Temes and M. Jahanbegloo, *Electronics Letters,* Feb. 1, 1979, Vol. 15, No. 3, pages 87–88; and Basic Principles of Switched-Capacitor Filters Using Voltage Inverter Switches, by A. Fettweis, *Arch. Electron. & Ubertragungstech.,* 1979, Vol. 33, pages 13–19. A principal drawback of these floating inductor simulation circuits is that both plates of some integrated capacitors of the circuits are switched between floating nodes. This means that the simulated inductor is sensitive to parasitic capacitance effects associated with both plates of integrated capacitors thereof. In a floating MOS integrated capacitor, the bottom plate parasitic capacitance, for example, is the stray capacitance between the bottom electrode of the integrated capacitor and a substrate that is normally at AC ground potential. The parasitic capacitance associated with the top plate of such an integrated capacitor is known to be small such that its effect is usually negligible. Compensation techniques are required, however, to eliminate the effect of parasitic capacitance associated with the bottom plate of a floating capacitor. Compensation schemes are described in the article, "Compensation for Parasitic Capacitances in Switched-Capacitor Filters," by G. C. Temes and R. Gregorian, *Electronics Letters,* 1979, Vol. 15, pages 377–379. An object of this invention is the provision of an improved switched capacitor floating inductor simulation circuit. Another object is provision of a switched capacitor floating inductor simulation circuit that is relatively insensitive to parasitic capacitance effects associated with the plates of integrated capacitors thereof.

SUMMARY OF THE INVENTION

In accordance with this invention, apparatus for simulating an integratable switched capacitor floating inductor across a pair of nodes comprises: first and second voltage follower means having input terminals connected to associated nodes and having output terminals; first, second and third capacitors C1, C2 and C3; integrator means including a fourth capacitor C4; and switch means associated with C1, C2 and C3 and being periodically operative in first and second switched states; operation of the switch means in the first state electrically connecting C1 and C2 across associated voltage follower means for discharging these capacitors, and electrically connecting C3 between the output lines of the voltage follower means for charging C3 with an input voltage that is connected to the nodes and translated to the outputs of the voltage follower means; operation of the switch means in the second state electrically connecting C3 to the integrator means for causing the latter to integrate the charge stored by C3 and produce an output voltage, and electrically connecting C1 and C2 to the integrator means for charging these capacitors to the output voltage on the latter. A floating inductance $L = T^2 C4 / C1 C3$ is presented across the nodes, where T is the reciprocal of the sampling frequency for the switched capacitors and $C1 = C2$, when the circuit is characterized by the LDI transformation.

DESCRIPTION OF DRAWING

This invention will be more fully understood from the following detailed description of preferred embodiments thereof, together with the drawing in which.

In the following description and drawing, the upper case letter C and an associated numeral is used to designate both a particular capacitor and the capacitance thereof, the context in which it is used specifying the meaning thereof.

DESCRIPTION OF PREFERRED EMBODIMENTS

This invention is described in the article "Switched Capacitor Filters Using Floating-Inductance Simulation Circuits" by Man Shek Lee, *Electronic Letters,* Sept. 27, 1979, Vol. 15, No. 20, pages 644–645, which is incorporated herein by reference.

Figure 1:
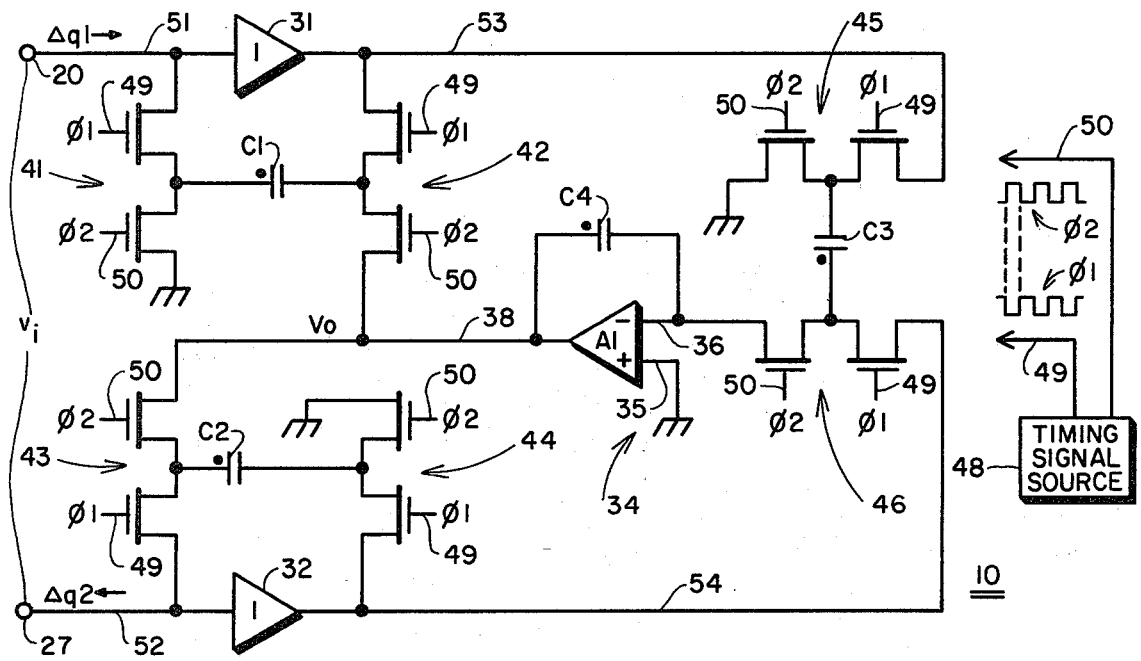
FIG. 1 is a schematic circuit diagram of a preferred embodiment of this invention.

In a preferred embodiment of this invention in FIG. 1 that is implemented in fully integrated circuit form, a switched capacitor circuit 10 for simulating a floating inductor across a pair of nodes 20 and 27 thereof comprises: a pair of voltage follower circuits 31 and 32; an active integrator circuit 34; switched capacitors C1, C2 and C3; and a plurality of transistor switch means 41–46 that are associated with different ones of the switched capacitors. The dots adjacent the one sides of integrated capacitors indicate the locations of the top plates thereof.

The integrator circuit 34 comprises a fourth integrated capacitor C4 and an integrated differential-input operational amplifier A1 which is essentially a voltage-controlled voltage source having a very low output impedance, a very high input impedance, and providing whatever output current is demanded by external circuitry. The non-inverting input line 35 of A1 is directly electrically connected to ground. The operation of A1 then causes the inverting input line 36 thereof to be at a virtual ground potential. The integrating capacitor C4 is connected across the integrator with the top and bottom plates thereof connected to the output line 38 and inverting input line 36 of A1. Consideration of this integrated structure reveals that the parasitic capacitance associated with the top plate of C4 can not change the output impedance of A1 since this output impedance is substantially zero ohms. Further, since the bottom plate of the integrated capacitor C4 is connected to the virtual ground potential on line 36, this essentially short circuits the parasitic capacitance associated with this plate to ground for eliminating any adverse effects associated with it. Thus, it is seen that connecting the top and/or bottom plates of an integrated capacitor to the output terminal of a voltage source and ground or virtual ground obviates the parasitic capacitance effects associated with them.

Each of the voltage follower circuits 31 and 32 can be an integrated differential input operational amplifier having its non-inverting input connected to an associated one of the nodes and its output directly electrically connected to the inverting input thereof. These voltage followers are essentially voltage-controlled voltage sources that have very high input impedances and very low output impedances. Alternatively, the circuits 31 and 32 can be other types of voltage followers. Since the gain of a voltage follower is by definition substantially unity, the voltage between the lines 53 and 54 is substantially equal to an input voltage $v_i$ that is connected across the nodes 20 and 27.

In an integrated circuit embodiment of the circuit 10 that is implemented with MOS technology, each of the switch means 41–46 comprises a pair of series connected MOS FET transistors having gate electrodes that are driven by different ones of a pair of two-phase non-overlapping digital timing control signals $\phi 1$ and $\phi 2$ from a source 48. The intermediate terminal between the transistors of each switch means is connected to a side of an associated integrated switched capacitor. The control signals $\phi 1$ and $\phi 2$ are 180° out-of-phase with each other, as is illustrated by the waveforms in FIG. 1, and preferably have a 50% duty cycle. The switching frequency $f_s$ of the control signals is $f_s = 1/T$, where T is the period of a switching cycle. It is known that the switching frequency should be greater than the Nyquist sampling frequency.

In operation, the switch means 45 and 46 are poled for connecting C3 between the output lines 53 and 54 of the voltage followers when the control signal $\phi 1$ is high. This causes C3 to sense the input voltage $v_i$. When the control signal $\phi 2$ subsequently goes high, switch means 45 and 46 connect C3 between ground and the inverting input of A1. Since line 36 is set at a virtual ground potential by the operation of A1, this causes all of the charge on C3 to be transferred to C4. Thus, the input voltage is integrated by the circuit 34 and stored on C4. The switch means 41–44 are responsive to a positive voltage in the control signal $\phi 2$ for connecting C1 and C2 between the output line 38 of the integrator and ground for causing them to charge to the voltage $V_o$. Finally, the switching means 41–44 are responsive to a positive voltage in the control signal $\phi 1$ for connecting and discharging C1 and C2 across associated voltage followers. This creates a current in lines 51 and 52 having an average value that is proportional to the integral of the input voltage $v_i$ so that this circuit effectively simulates an inductor between nodes 20 and 27.

The aforementioned operation of switch means 45 alternately connects the bottom plate of the integrated capacitor C3 to ground and the output line 53 of a voltage source 31 so that the bottom plate parasitic capacitance of C3 does not have a deliterious effect on the operation of the circuit. The switch means 46, however, alternately connects the top plate of C3 to a virtual ground point on A1 and the output line 54 of voltage source 32 so that the circuit is sensitive to only the top plate parasitic capacitance effects of C3. In a similar manner, the switch means 42 and 44 operate to connect the bottom plates of C1 and C2 between the output line of an associated voltage follower and either the output line of the voltage source A1 or ground for rendering the circuit 10 insensitive to the bottom plate parasitic capacitance effects of these integrated capacitors C1 and C2. The switch means 41 and 43, however, periodically connect the top plates of these capacitors C1 and C2 to associated nodes 20 and 27 which are floating so that the circuit 10 simulates a truly floating LDI (lossless discrete integrator) inductor when circuit 10 is characterized by the LDI analog to digital transformation as is described more fully hereinafter. Although this means that there is no compensation for the top plate parasitic capacitances of C1, C2 and C3, this has little effect on the operation of the circuit 10 since they are normally very small. Thus, as long as a plate of an integrated capacitor is either switched between ground potentials, or between the output terminals of voltage sources, or between a ground potential and the output of a voltage source, then the parasitic capacitance associated with that plate is essentially eliminated or isolated from a circuit embodying the integrated capacitor so that such a circuit is insensitive to bottom plate parasitic capacitance effects.

The lossless discrete integrator (LDI) analog to digital transformation $$S = \frac{1}{T}(z^{\frac{1}{2}} - z^{-\frac{1}{2}}) \tag{1}$$

is proposed for digital filter design by L. T. Bruton in his article, "Low Sensitivity Digital Ladder Filters," *IEEE Transactions on Circuits and Systems*, Vol. 22, pages 168–176, 1975. This transformation maps the portion $$-\frac{2}{T} \leq \Omega \leq \frac{2}{T} \tag{2}$$

of the imaginary axis in the s-plane onto the unit circle in the z-plane where $\Omega$ is the continuous time frequency. The relationship between the continuous time frequency $\Omega$ and the discrete time frequency $\omega$ is $$\Omega = \frac{2}{T} \sin \frac{\omega T}{2} \tag{3}$$

where T is the sampling period which is the reciprocal of the switching frequency.

The current in an inductor in the continuous time domain is representable as $$i(t) = \int \frac{v(t)}{L} dt \tag{4}$$

which has a Laplace representation $$I(s) = \frac{V(s)}{sL} \tag{5}$$

where s is the Laplace operator. The current is also representable as $$i(t) = \frac{dq(t)}{dt} \qquad (6)$$

which has a Laplace representation $$I(s) = sQ(s) \qquad (7)$$

Equating the expressions in equations (5) and (7), applying the LDI transformation in equation (1) to these expressions in equations (5) and (7), and solving for the charge Q(z) in the discrete time domain provides $$Q(z) = \frac{T^2}{L} \frac{z^{-1}}{(1 - z^{-1})} V(z) \qquad (8)$$

Defining the difference in charge in the discrete time domain as the difference in charge between adjacent sampling points, then $$\Delta q(nT) = q(nT) - q(nT - T) \qquad (9)$$

which is representable in the z domain as $$\Delta Q(z) = Q(z) - Q(z)z^{-1} \qquad (10)$$
$$= Q(z)(1 - z^{-1})$$

Employing the definition of charge in equation (8) here, the generalized representation of the differential charge-voltage relationship $$\Delta Q(z) = \frac{T^2}{L} \frac{z^1}{(1 - z^{-1})} V(z) \qquad (11)$$

for a discrete time LDI inductor is obtained. It is desirable that the circuit 10 in FIG. 1 simulate this function across nodes 20 and 21.

Considering now the circuit in FIG. 1, the differential charge in line 51 between adjacent sample times is $$\Delta q(nT) = q(nT) - q(nT - T) \qquad (12)$$
$$= C1 v_o(nT - T/2)$$

where $v_o$ is the output voltage of integrator 34, q(nT) is the net charge in line 51 from time $-\infty$ to time nT, and q(nT−T) is the net charge in line 51 from time $-\infty$ to time (nT−T). The differential charge in line 52 during this time interval is also defined by equation (12) for C1=C2. Recognizing that the output voltage $V_o$ of the integrator 34 is the integral of the input voltage $v_i(t)$ between the lines 51 and 52, and also between lines 53 and 54, these voltages are related in the expression $$C4v_o(nT - T/2) - C4v_o(nT - 3T/2) = C3v_i(nT - T) \qquad (13)$$

for the differential charge in the integrated capacitor C4. Applying the z-transform to equations (12) and (13), one obtains the expressions $$\Delta Q(z) = C1 V_o(z) z^{-\frac{1}{2}} \qquad (14)$$

and $$C4 V_o(z) z^{-\frac{1}{2}} - C4 V_o(z) z^{-3/2} = C3 V_i(z) z^{-1} \qquad (15)$$

Solving for the output voltage in equation (15), one obtains $$V_o(z) = \frac{C3 V_i(z) z^{-1}}{C4(z^{-\frac{1}{2}} - z^{-3/2})} \qquad (16)$$

Simplifying equation (16) and substituting it into equation (14), one obtains the desired differential charge-voltage relationship $$\Delta Q(z) = \frac{C1 z^{-\frac{1}{2}} C3 z^{-1}}{C4(z^{-\frac{1}{2}} - z^{-3/2})} V(z) \qquad (17)$$
$$= \frac{C1 C3}{C4} \frac{z^{-1}}{(1 - z^{-1})} V(z)$$

for the simulation circuit in FIG. 10.

Comparing equations (11) and (17) reveals that they are of the same form with $$\frac{T^2}{L} = \frac{C1 C3}{C4} \qquad (18)$$

such that the circuit 10 simulates a truly floating LDI inductor that is substantially insensitive to parasitic capacitance effects in an integrated implementation thereof, with a simulated inductance $$L = T^2 \frac{C4}{C1 C3} \qquad (19)$$

for C1=C2. Thus, in a preferred embodiment of this invention the simulated inductance is dependent on the switching frequency of the circuit 10 and the ratio of the capacitances of integrated capacitors which can be closely controlled in an integrated circuit. The values of the capacitors can be chosen to provide the desired inductance and to optimize the capacitance ratio. The circuit 10 will also simulate an inductor when the capacitances of C1 and C2 are different values, although the simulated inductor may not then be an LDI inductor. In an integrated circuit implementation of this invention, the capacitances of C1–C4 are preferably approximately the same value.

Figure 2:
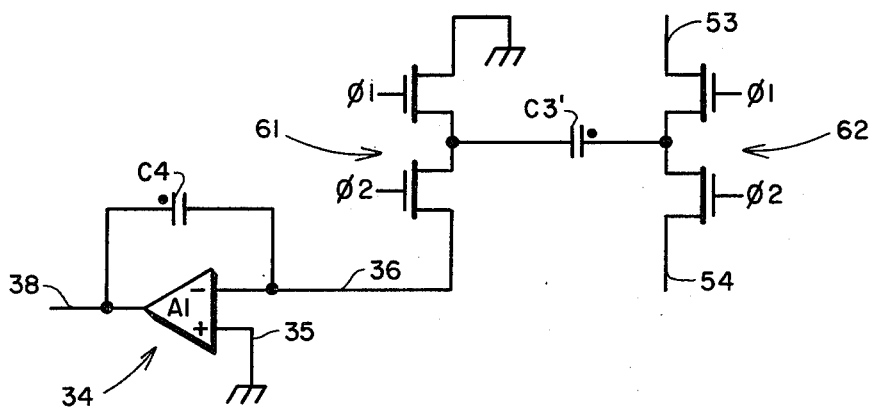
FIGS. 2 and 3 are schematic circuit diagrams of alternate embodiments of the invention.

In the alternate embodiment of this invention in FIG. 2, the switched-integrated capacitor C3′ is associated with a pair of switch means 61 and 62 that have intermediate terminals connected to opposite sides of C3′. The integrated transistors of switch means 61 are electrically connected in series between the inverting input of A1 and ground. The integrated transistors of switch means 62 are electrically connected in series between the output lines 53 and 54 of the voltage follower circuits 31 and 32. Since both sides of C3′ are either switched between ground potentials or between the output terminals of voltage sources, the overall circuit 10 embodying it will be insensitive to both top and bottom plate capacitance effects associated with C3′ as was more fully described earlier. Thus, the direction in which the integrated capacitor C3′ is connected to associated switch means is not important. In either case, the simulation circuit in FIG. 2 is insensitive to parasitic capacitance effects associated with both the top and bottom plates of C3′.

In operation, when $\phi_1$ is high, C3′ is connected between the output line 53 of voltage follower 31 and ground so that it is charged to the voltage on line 53. When $\phi 2$ is high, C3' is connected between the output of voltage follower 32 and the inverting input of A1. This causes C3' to discharge into the circuit 34 so that C4 is charged to the sum of the output voltage of voltage follower 32 and the charge voltage on C3'. The remainder of the circuit 10 operates as previously described for simulating a floating inductor.

Figure 3:
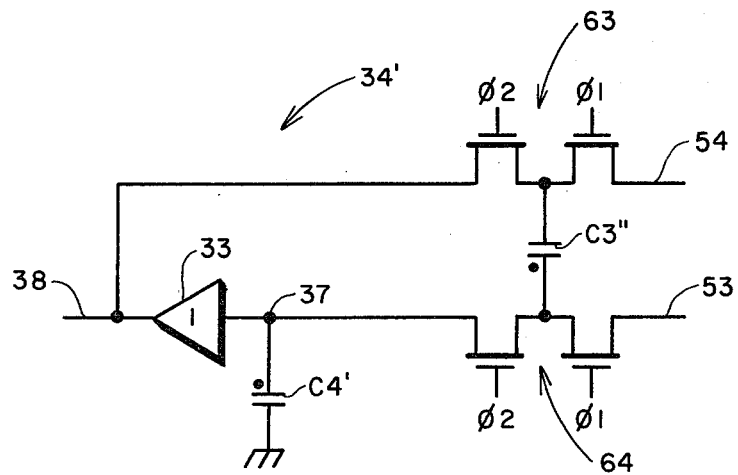

In another alternate embodiment of this invention in FIG. 3, the integrator circuit is a voltage follower type integrator circuit 34' and the switched capacitor C3'' is associated with switch means 63 and 64. The integrator 34' comprises an integrated capacitor C4' that is electrically connected between ground and the input terminal of a voltage follower circuit 33. Since only the top plate of the integrating capacitor C4' is floating, the uncompensated parasitic capacitance effects associated with C4 are negligible. The integrated transistors in switch means 63 are connected in series between the output line 54 of the voltage follower 32 and the output of a voltage follower type of voltage source 33. The integrated transistors of switch means 64 are connected in series between the output terminal 53 of the voltage follower 31 and the input to the voltage follower 33. Since only the top plate of C3'' is periodically connected to a floating node 37 at the input of voltage follower 33, the uncompensated parasitic capacitance effects associated with the top plate of C3'' are also negligible.

In operation, when $\phi 1$ is high, C3'' is charged to the voltage $v_i$ that is coupled to the output lines 53 and 54 of the voltage followers 31 and 32. When $\phi 2$ is high, C3'' is connected across the voltage follower 33 and discharged into C4' for causing it to integrate the input voltage. The output voltage on line 38 is equal to the integrated voltage on C4'. The remainder of the simulation circuit 10 operates in the same manner as was previously described for simulating a floating inductor across the nodes 20 and 27.

Although this invention is described in relation to preferred embodiments thereof, variations and modifications will occur to those skilled in the art. By way of example, the simulation circuit 10 may be realized with integrated circuit technologies other than MOS and in other than fully integrated circuit form. The circuit 10 may also be fully implemented with discrete components and with only a portion thereof in integrated circuit form. Further, the switch means may comprise other types of switching elements such as discrete transistors, mechanical switches, relays, and other types of integrated switches. Additionally, the circuits 31, 32 and 33 may comprise other types of voltage followers. Also, this invention is useful in applications other than in integrated circuits and active filters. Additionally, the duty cycle of the timing control signals may be less than 50%, although it should not exceed this value. And in application where a pair of the circuits 10 in FIG. 1 are connected for simulating a pair of series connected inductors, for example, a plurality of voltage followers with input terminals connected to the same node can be replaced by a single voltage follower. The scope of this invention is therefore to be determined from the attached claims rather than from the aforementioned detailed descriptions of preferred embodiments thereof.

What is claimed is:

1. An integratable switched-capacitor floating-inductor simulation circuit comprising:

first and second nodes adapted for receiving an input voltage;

first and second voltage follower means having input terminals connected to said first and second nodes, respectively, and having output terminals across which the input voltage is established;

first, second and third capacitors having capacitances C1, C2, and C3;

integrator means including a fourth capacitor having a capacitance C4 associated therewith, and having an input and an output terminal; and switch means associated with said first, second and third capacitors and being periodically operative in first and second switch states; operation of said switch means in the first state electrically connecting said first and second capacitors across said first and second voltage follower means, respectively, for discharging these capacitors, and electrically connecting said third capacitor to the output terminal of at least one of said voltage follower means for charging said third capacitor with the output voltage thereof; operation of said switch means in the second state electrically connecting said third capacitor to said integrator means for causing the latter to integrate the charge on said third capacitor and produce an output voltage that is proportional to the integral of the input voltage that is available on the output terminals of said voltage follower means, and electrically connecting said first and second capacitors to said integrator means for charging these two capacitors to the output voltage, whereby a switched-capacitor floating-inductor is simulated across said first and second nodes.

2. The circuit according to claim 1 wherein said switch means completes a cycle of operation in the two switch states every T seconds and $f=1/T$ is the sampling frequency for the switched capacitors which is greater than the Nyquist rate.

3. The circuit according to claim 2 wherein the fourth capacitor is the integrating capacitor of said integrator means and the simulated inductance is representable as $L=T^2C4/C1C3$, where $C1=C2$ and the circuit is characterized by the LDI transformation.

4. The circuit according to claim 2 wherein the output voltage of said integrator means is produced with respect to a ground reference potential, said switch means being operative in the second state for electrically connecting said first and second capacitors between the output terminal of said integrator means and ground for charging these capacitors to the output voltage.

5. The circuit according to claim 4 wherein said switch means is operative in the first switch state for connecting said third capacitor in series with the output terminals of said first and second voltage follower means for charging it with the voltage that is available at said first and second voltage follower means output terminals, and is operative in the second state for electrically connecting said third capacitor between ground and the input terminal of said integrator means.

6. The circuit according to claim 4 wherein said integrator means comprises a differential input operational amplifier having one input terminal electrically connected to ground, said fourth capacitor being electrically connected between the other input terminal and the output terminal of said differential amplifier, said switch means being operative in the second state for electrically connecting said third capacitor between ground and the other input terminal of said differential amplifier which is at a virtual ground potential for discharging said third capacitor into said fourth capacitor.

7. The circuit according to claim 4 wherein said switch means is operative in the first state for electrically connecting said third capacitor between the output terminal of said first voltage follower means and ground for charging it with the output voltage therebetween.

8. The circuit according to claim 7 wherein said switch means is operative in the second state for connecting said third capacitor between the output terminal of said second voltage follower means and the input terminal of said integrator means for causing said fourth capacitor to integrate the charge voltage on said third capacitor and the output voltage of said second voltage follower means.

9. The circuit according to claim 8 wherein said integrating means comprises a differential input operational amplifier having one input terminal electrically connected to ground, said fourth capacitor being electrically connected between the other input terminal and the output terminal of said amplifier, said switch means being operative in the second state for electrically connecting said third capacitor between the other input terminal of said amplifier and the output terminal of said second voltage follower means.

10. The circuit according to claim 4 wherein said integrator means is a voltage follower type integrator means, said switch means being operative in the first switch state for electrically connecting said third capacitor in series with the output terminals of said first and second voltage follower means for charging it with the input voltage that is available at these output terminals, and being operative in the second state for electrically connecting said third capacitor across said voltage follower integrator means for causing the latter to integrate the charge voltage on said third capacitor.

11. The circuit according to claim 10 wherein said integrator means comprises a third voltage follower means having an output terminal and having an input terminal that is electrically connected through said fourth capacitor to ground, said switch means being operative in the second switch state for electrically connecting said third capacitor between the input and output terminals of said third voltage follower means for causing said third capacitor to discharge into said fourth capacitor.

12. The circuit according to claim 4 which is implemented in integrated circuit form in which said first, second, third and fourth capacitors are integrated capacitors having the bottom plates thereof electrically connected to or switched between ground and virtual ground potentials, electrically connected to or switched between output terminals of a voltage source such as a voltage follower means, or electrically switched between ground and the output terminal of a voltage source for rendering the circuit substantially insensitive to parasitic capacitance effects associated with the bottom plates of said integrated capacitors.

13. The circuit according to claim 12 wherein said switch means comprises:
timing means providing continuous non-overlapping in-phase and out-of-phase timing control signals $\phi 1$ and $\phi 2$, said timing signals having a period T;
first and second integrated switching transistors having first terminals electrically connected to the top and bottom plate sides of said first capacitor and having second terminals connected to the input and output terminals of said first voltage follower means, respectively, and having control electrodes receiving the same one of said timing signals;
third and fourth integrated switching transistors having first terminals connected to the top and bottom plate sides of said first capacitor and having second electrodes electrically connected to ground and to the output terminal of said integrator means, respectively, and having control electrodes receiving the same other timing signal;
fifth and sixth integrated switching transistors having first terminals electrically connected to top and bottom plate sides of said second capacitor and having second electrodes electrically connected to the input and output terminals of said second voltage follower means, respectively, and control electrodes receiving the one timing signal; and
seventh and eighth integrated switching transistors having first electrodes electrically connected to the top and bottom plate sides of said second capacitor and second electrodes electrically connected to the output terminal of said integrator means and to ground, respectively, and control electrodes receiving the other timing signal.

14. The circuit according to claim 13 wherein said switch means further comprises ninth and tenth integrated switching transistors having first electrodes electrically connected to one and other sides of said third capacitor and having second electrodes electrically connected to the output terminals of said first and second voltage follower means, respectively, and having control electrodes receiving the first timing signal; and eleventh and twelfth integrated switching transistors having first electrodes electrically connected to the one and other sides of said third capacitor and having second electrodes connected to ground and to the input terminal to said integrator means, respectively, and having control electrodes receiving the other timing signal; said switching transistors being responsive to the timing signals for periodically connecting the first and second capacitors across associated voltage follower means when the third capacitor is connected across the outputs of the latter and the timing signals are of one phase, and for connecting the first and second capacitors between the output terminal of said integrator means and ground when said third capacitor is connected between the input terminal of said integrator means and ground and the timing signals are of the other phase.

15. The circuit according to claim 14 wherein said switching transistors are MOS FET transistors.

16. The circuit according to claim 4 wherein said switch means is operative in the first state for electrically connecting one and other sides of said first and second capacitors to the input and output terminals of associated voltage followers; said switch means being operative in the second state for electrically connecting the one and other terminals of said first capacitor to ground and to the output terminal of said integrator means, respectively, and for electrically connecting the one and other sides of said second capacitor to the output terminal of said integrator means and to ground, respectively.

17. The circuit according to claim 16 wherein said first and second capacitors are integrated capacitors with bottom plates associated with the other terminals thereof; said integrator means further comprising a voltage source type amplifier means having an output terminal connected to the output terminal of said integrator means for rendering the circuit substantially insensitive to parasitic capacitance effects associated with the bottom plates of said first and second integrated capacitors.

* * * * *